United States Patent
Kato et al.

(10) Patent No.: US 8,465,904 B2
(45) Date of Patent: Jun. 18, 2013

(54) METHOD FOR PREPARING A PRINTING FORM FROM A PHOTOPOLYMERIZABLE ELEMENT

(75) Inventors: Masayuki Kato, Newark, DE (US); John R. Shock, Princeton, NJ (US)

(73) Assignee: E I du Pont de Nemours and Company, Wilmington, DE (US)

( * ) Notice: Subject to any disclaimer, the term of this patent is extended or adjusted under 35 U.S.C. 154(b) by 343 days.

(21) Appl. No.: 12/576,370

(22) Filed: Oct. 9, 2009

(65) Prior Publication Data
US 2010/0112484 A1    May 6, 2010

Related U.S. Application Data

(60) Provisional application No. 61/198,441, filed on Oct. 31, 2008.

(51) Int. Cl.
- *G03F 7/26* (2006.01)
- *G03F 7/36* (2006.01)
- *G03F 7/40* (2006.01)
- *B41N 1/08* (2006.01)

(52) U.S. Cl.
USPC ........... 430/302; 430/300; 430/309; 101/453; 101/463.1

(58) Field of Classification Search
USPC ................... 430/300, 302, 306, 309
See application file for complete search history.

(56) References Cited

U.S. PATENT DOCUMENTS

| | | | |
|---|---|---|---|
| 5,250,389 A | 10/1993 | Nakamura et al. | |
| 5,578,420 A * | 11/1996 | Takagi et al. | 430/306 |
| 5,889,116 A | 3/1999 | Suzuki et al. | |
| 2003/0211423 A1 | 11/2003 | Mengel et al. | |
| 2004/0048199 A1 * | 3/2004 | Schadebrodt et al. | 430/306 |
| 2004/0259034 A1 | 12/2004 | Schadebrodt et al. | |
| 2008/0248428 A1 | 10/2008 | Teltschik et al. | |
| 2008/0254385 A1 * | 10/2008 | Yamazawa et al. | 430/286.1 |

FOREIGN PATENT DOCUMENTS

| | | |
|---|---|---|
| EP | 1 239 329 A2 | 9/2002 |
| EP | 1 400 857 A1 | 3/2004 |
| JP | 2001-147520 | 5/2001 |
| JP | 2003 131 376 A | 5/2003 |
| JP | 2004-163533 | 6/2004 |
| JP | 2004-246247 | 9/2004 |
| WO | WO 2005/050327 * | 6/2005 |
| WO | WO 2005/121896 * | 12/2005 |

OTHER PUBLICATIONS

Tufprene, Asaprene T, Styrene-Butadiene Thermoplastic Elastomers, The SBS elastomers from Asahi Kasei—Apr. 1, 2010.*

* cited by examiner

*Primary Examiner* — Anca Eoff

(57) ABSTRACT

The invention provides a method for preparing a printing form from a photopolymerizable element. The photopolymerizable element includes a layer of a photopolymerizable composition containing an elastomeric block copolymer of polystyrene and polybutadiene having less than 15% by weight of 1,2-coupled bond segments in the polybutadiene block, an ethylenically unsaturated compound, and a photoinitiator. The method includes imagewise exposing the photopolymerizable element to actinic radiation in the presence of atmospheric oxygen; heating the element to a temperature sufficient to cause a portion of the layer to liquefy; and contacting an exterior surface of the photopolymerizable element with a development medium to allow at least a portion of the liquefied layer to be removed by the development medium.

16 Claims, No Drawings

METHOD FOR PREPARING A PRINTING FORM FROM A PHOTOPOLYMERIZABLE ELEMENT

BACKGROUND OF THE INVENTION

1. Field of the Disclosure

This invention pertains to a method for preparing a printing form from a photopolymerizable element, and in particular to a method for preparing a relief printing form that includes a layer of a photopolymerizable composition having an elastomeric block copolymer.

2. Description of Related Art

Flexographic printing plates are well known for use in printing surfaces which range from soft and easy to deform to relatively hard, such as packaging materials, e.g., cardboard, plastic films, aluminum foils, etc. Flexographic printing plates can be prepared from photosensitive elements containing photopolymerizable compositions, such as those described in U.S. Pat. Nos. 4,323,637 and 4,427,759. The photopolymerizable compositions generally comprise an elastomeric binder, at least one monomer and a photoinitiator. Photosensitive elements generally have a photopolymerizable elastomeric layer interposed between a support and a coversheet or multilayer cover element. Upon imagewise exposure to actinic radiation, photopolymerization of the photopolymerizable layer occurs in the exposed areas, thereby curing and rendering insoluble the exposed areas of the layer. The element is treated with a suitable solution, e.g., solvent or aqueous-based washout, or thermally, to remove the unexposed areas of the photopolymerizable layer leaving a printing relief which can be used for flexographic printing.

An alternative to solution development, the thermal development process is desired as the process removes the unexposed areas while avoiding the subsequent time-consuming drying step associated with solution development. In a thermal development process, the photosensitive layer, which has been imagewise exposed to actinic radiation, is contacted with an absorbent material at a temperature sufficient to cause the composition in the unexposed portions of the photosensitive layer to soften or melt and flow into an absorbent material. See U.S. Pat. No. 3,060,023 (Burg et al.); U.S. Pat. No. 3,264,103 (Cohen et al.); U.S. Pat. No. 5,015,556 (Martens); U.S. Pat. No. 5,175,072 (Martens); U.S. Pat. No. 5,215,859 (Martens); and U.S. Pat. No. 5,279,697 (Peterson et al.). The exposed portions of the photosensitive layer remain hard, that is do not soften or melt, at the softening temperature for the unexposed portions. The absorbent material collects the softened un-irradiated material and then is separated from the photosensitive layer. The cycle of heating and contacting the photosensitive layer with the absorbent material may need to be repeated several times in order to sufficiently remove the flowable composition from the un-irradiated areas and form a relief structure suitable for printing. After such processing, there remains a raised relief structure of irradiated, hardened composition that represents the irradiated image.

However with increasing demands on quality, the current state-of-the-art flexographic printing forms may not perform as desired and have trouble meeting the ever increasing demands on quality. One weakness in many flexographic printing plates, especially in large areas of solid coverage, is poor transfer of ink to the substrate resulting in print defects. This property is usually seen most often in high durometer flexographic printing plates. Unsatisfactory printing results are especially obtained with solvent based printing inks, and with UV-curable printing inks. For flexographic printing plates having poor ink transfer, a higher amount of physical impression is necessary during printing to increase the tonal density of solid image areas. But higher impression leads to higher dot gain in screened image areas, which creates an undesired printed image. Especially when printing on critical printing materials like, for example, foils, a lot of print defects can be observed.

It is desirable for a flexographic printing plate to have a relief structure that can print a complete tonal range that includes dense uniform solid coverage and fine printing elements, such as fine sharp lines and highlight dots, i.e., halftone dots having less than about 5%, and in some cases less than about 2%, of a solid area printed. The conditions associated with thermal development can tend to distort the fine printing elements and highlight dots in the relief structure of the printing plate. In addition, the absorbent material may create marks on the contacted surface of a thermally developed flexographic printing plate, sometimes referred to as web-marks, such that in some cases the marks can be observed in the image printed on the substrate.

So a need arises for a method that is simple and relatively quick in preparing a printing form from a photopolymerizable element. It is desirable for the method to prepare the printing form to have a relief structure that improves transfer of ink to the substrate. It is desirable for the method to prepare a printing form having a relief structure capable of printing a full tonal range including printing of fine print elements and highlight dots and thereby providing improved print quality. It is also desirable for the method to prepare a printing form that is not readily susceptible to marking from the absorbent material associated thermal development, or, if markings from the absorbent material are present on the printing form, the markings are not observed in the image printed by the printing form.

SUMMARY OF THE INVENTION

The present invention provides a method for preparing a printing form from a photopolymerizable element comprising a layer of a composition containing at least one elastomeric block copolymer having one or more non-elastomeric blocks and one or more elastomeric blocks of polybutadiene having 1,2-coupled butadiene units, an ethylenically unsaturated compound and a photoinitiator, wherein the composition layer is capable of being partially liquefied, and wherein the 1,2-coupled butadiene units comprise less than 15% by weight of the one or more polybutadiene blocks. The method comprises a) providing the photopolymerizable element; b) imagewise exposing the photopolymerizable element to actinic radiation in the presence of atmospheric oxygen; heating the element of b) to a temperature sufficient to cause a portion of the layer to liquefy; and d) contacting an exterior surface of the photopolymerizable element with a development medium to allow at least a portion of the liquefied layer to be removed by the development medium.

DETAILED DESCRIPTION OF THE PREFERRED EMBODIMENTS

The present invention provides a method for preparing a printing form from a photopolymerizable element. The photopolymerizable element can be used as a printing form for relief printing, e.g., flexographic and letterpress, from raised surfaces of the relief. The photopolymerizable element is formed from a layer of a photosensitive composition that includes an elastomeric binder, at least one ethylenically unsaturated compound, and a photoinitiator. The present method facilitates the preparation of the printing form by using digital workflow to create a mask image for the photopolymerizable element, and by thermally developing the element to create the relief structure for the printing form. Surprisingly and unexpectedly, the present method prepares a printing form that is capable of increased transfer of ink to the substrate, providing increased density of ink particularly in solid areas of the printed image. Also, the present method prepares the printing form that is capable of improved print quality resulting from increased tonal range including ability to hold fine printing elements, such as fine sharp lines and highlight halftone dots (halftone dots less than about 2%), and dense uniform solid coverage. The present method prepares the printing form from the photopolymerizable printing element by thermally developing in contact with a development medium, wherein the resulting printing form has no markings or only minimal markings and/or only mild markings that can result from contact with the development medium such that the printed image has high quality, with no non-uniformities or disturbances in the printed image from the markings.

The photopolymerizable printing element includes at least one layer of a photopolymerizable composition. As used herein, the term "photopolymerizable" is intended to encompass systems that are photopolymerizable, photocrosslinkable, or both. In cases where the composition layer comprises more than one photopolymerizable layer on the substrate, the composition of each of the photopolymerizable layers can be the same or different from any of the other photopolymerizable layers. The photopolymerizable layer is a solid layer composed of the elastomeric binder, a monomer, and a photoinitiator. In one embodiment, the layer is elastomeric. The photoinitiator has sensitivity to actinic radiation. Throughout this specification actinic radiation will include ultraviolet radiation and/or visible light. In one embodiment, the solid layer of the photopolymerizable composition can be image-wise exposed and treated with heat to form a relief suitable for printing. As used herein, the term "solid" refers to the physical state of the layer that has a definite volume and shape and resists forces that tend to alter its volume or shape. The layer of the photopolymerizable composition is solid at room temperature, which is a temperature between about 5° C. and about 30° C. A solid layer of the photopolymerizable composition may be polymerized (photohardened), or unpolymerized, or both.

Unless otherwise indicated, the terms "photopolymerizable element", "printing form precursor", and "printing form" encompass elements or structures in any form suitable for printing, including, but not limited to, flat sheets, plates, seamless continuous forms, cylindrical forms, plates-on-sleeves, and plates-on-carriers. It is contemplated that printing form resulting from the photopolymerizable element has end-use printing applications for relief printing, such as flexographic and letterpress printing. The photopolymerizable element may also be referred to herein as a photosensitive element, and can be considered a precursor to the relief printing form.

The photosensitive composition forming the layer is composed of an elastomeric binder, an ethylenically unsaturated compound, and a photoinitiator. The elastomeric binder is a preformed polymer that serves as a matrix for the monomer and photoinitiator system prior to exposure and is a contributor to the physical properties of the photopolymer both before and after exposure.

In the present invention the photopolymerizable element includes the elastomeric binder which is a thermoplastic elastomeric block copolymer composed of one or more non-elastomeric blocks and one or more elastomeric blocks, where A represents a non-elastomeric block of a vinyl-substituted aromatic hydrocarbons, and B represents an elastomeric block of polybutadiene. Styrene and methylstyrene are examples of suitable vinyl-substituted aromatic hydrocarbons. In general, compared to styrene-isoprene block copolymers as a binder, the elastomeric binder of the styrene-butadiene block copolymer can provide the printing form with wider scale holding across a range of dot sizes (i.e., can print smaller highlight dots and lower tonal values). The elastomeric binder may also be referred to herein as an elastomeric block copolymer, or a styrene-butadiene binder, or a styrene-butadiene block copolymer. In most embodiments, the styrene-butadiene block copolymer is linear block copolymers. In other embodiments, the styrene block copolymer can be radial block copolymers, star block-copolymers, or quasi-radial block copolymers. The block copolymer may be fully or partially hydrogenated. The elastomeric styrene-butadiene binder can include tri-block A-B-A copolymers, two block copolymers of the A-B type, or multi-block copolymers that include a plurality of alternating elastomeric and thermoplastic blocks, for example A-B-A-B-A, or mixtures thereof. For example, the elastomeric binder can contain a mixture of a tri-block copolymer of polystyrene-polybutadiene-polystyrene and a di-block copolymer of styrene and butadiene. The photopolymerizable composition may include two or more styrene-butadiene block copolymers, wherein each of the block copolymers is composed of a mixture of a tri-block copolymer and a di-block copolymer. In some embodiments, the elastomeric styrene-butadiene binder is composed of a linear tri-block copolymer and a di-block copolymer, where the content of the di-block copolymer is less than 20% by weight based on the weight of the binder. In some other embodiments, the elastomeric styrene-butadiene binder is composed of a linear tri-block copolymer and a di-block copolymer, where the content of the di-block copolymer is less than 10% by weight based on the weight of the binder. In yet other embodiments, the elastomeric styrene-butadiene binder is composed of a linear tri-block copolymer and a di-block copolymer, where the content of the di-block copolymer is less than 5% by weight based on the weight of the binder. In some cases, it may be desirable for the elastomeric styrene-butadiene binder to have low content of di-block copolymer, i.e., less than about 3% by weight based on the weight of the binder, to reduce the likelihood of the printing form retaining marks induced by the development medium (i.e., web-marks) used for thermal treatment. The ratio of non-elastomeric block to elastomeric block is in the range of from 10:90 to 40:60. In some embodiments, the content of the non-elastomeric blocks, i.e., styrene content, is from 15 to 35% by weight, based on the total of non-elastomeric blocks and elastomeric blocks in the binder. In some embodiments, the content of the non-elastomeric blocks, i.e., styrene content, is from 20 to 33% by weight, based on the total of non-elastomeric blocks and elastomeric blocks in the binder.

The polybutadiene block includes butadiene segments that have 1,4-coupled bond segments and 1,2-coupled bond segments. The coupled bond segments may also be referred to herein as coupled units or as vinyl units. In some embodiments, the one or more elastomeric blocks of polybutadiene of the styrene-butadiene block copolymer includes less than 15% by weight of the 1,2-coupled bond segments. That is, of the elastomeric blocks of polybutadiene in the styrene-butadiene block copolymer less than 15% by weight have 1,2-coupled bond segments. In principle, all the butadiene segments of the styrene-butadiene block copolymer may have no 1,2-coupled bond segments, that is, the butadiene segments may have only 1,4-coupled bond segments. However, for practical reasons it is difficult to obtain polybutadiene with such exclusively coupled bond segments, so that typically a minimum of the one of more elastomeric blocks of polybutadiene of the styrene-butadiene copolymer is about 5 to 7% by weight of the 1,2-coupled bond segments. In some embodiments, the one or more elastomeric blocks of polybutadiene of the styrene-butadiene block copolymer includes less than 14% by weight of the 1,2-coupled bond segments. In some embodiments, the one or more elastomeric blocks of polybutadiene of the styrene-butadiene block copolymer includes less than 13% by weight of the 1,2-coupled bond segments. In some other embodiments, the one or more elastomeric blocks of polybutadiene of the styrene-butadiene block copolymer includes less than 12% by weight of the 1,2-coupled bond segments. In some other embodiments, the one or more elastomeric blocks of polybutadiene of the styrene-butadiene block copolymer includes less than 11% by weight of the 1,2-coupled bond segments. In yet other embodiments, the one or more elastomeric blocks of polybutadiene of the styrene-butadiene block copolymer includes less than 10% by weight of the 1,2-coupled bond segments.

The molecular weight of the present styrene-butadiene block copolymer can be from 80,000 to 200,000 g/mol. In some embodiments, the molecular weight of the styrene-butadiene block copolymer is from 100,000 to 150,000 g/mol. Unless otherwise indicated the molecular weight of the polymeric binder is a mean molecular weight Mw determined with the aid of gel permeation chromatography using polystyrene standards.

The elastomeric binder of the styrene-butadiene block copolymer having less than 15% by weight of 1,2-coupled bond units is present in an amount of at least 30% by weight based on the photopolymerizable composition. In some embodiments, the elastomeric binder of the styrene-butadiene block copolymer is from 30 to 80% by weight of the photopolymerizable composition. In some other embodiments, the elastomeric block copolymer of styrene-butadiene is from 40% to 75% by weight of the photopolymerizable composition. In some other embodiments, the elastomeric binder of the styrene-butadiene block copolymer is from 50% to 75% by weight of the photopolymerizable composition. In yet other embodiments, the elastomeric binder of the styrene-butadiene block copolymer if from 55% to 70% by weight of the photopolymerizable composition.

The photopolymerizable composition may include two or more styrene-butadiene block copolymers each having the one or more elastomeric blocks of polybutadiene with less than 15% by weight of the 1,2-coupled bond segments in the polybutadiene blocks. In some embodiments where the photopolymerizable composition includes two or more styrene-butadiene block copolymers, the weighted average of the 1,2-coupled bond segments in the polybutadiene blocks is less than 15% by weight of the polybutadiene blocks in the two or more styrene-butadiene block copolymers, based on the total weight of the elastomeric binder. At least one of the styrene-butadiene copolymers of the two or more styrene-butadiene copolymers each with less than 15% by weight of the 1,2-coupled bond segments in the polybutadiene blocks should also have less than 20% by weight of the di-block copolymer (based on the one styrene-butadiene copolymer), and a molecular weight of 80,000 to 200,000 g/mol. In some embodiments, of the two or more styrene-butadiene copolymers each with less than 15% by weight of the 1,2-coupled bond segments, the at least one of the styrene-butadiene copolymers of in the polybutadiene blocks has less than 20% by weight of the di-block copolymer (based on the one styrene-butadiene copolymer), and a molecular weight of 80,000 to 200,000 g/mol and is present at greater than 20% by weight, and in other embodiments at least 30% by weight, of the photopolymerizable composition. The two or more styrene-butadiene copolymers each with less than 15% by weight of the 1,2-coupled bond segments in the polybutadiene blocks as the elastomeric binder combined are from 30 to 80% by weight of the photopolymerizable composition.

In some embodiments, the elastomeric binder is a styrene-butadiene-styrene tri-block copolymer having less than 20% by weight of styrene-butadiene di-block (based on the weight of the elastomeric binder); 20 to 32% by weight of styrene (based on the weight of the elastomeric binder); less than 10% by weight of 1,2-coupled butadiene segments (based on the polybutadiene block); and a molecular weight of about 100,000 to 200,000 g/mol.

The present elastomeric block copolymer of styrene-butadiene provides the layer of the photopolymerizable composition with an exterior surface opposite the support side that can be textured upon exposure in atmospheric oxygen and thermal development by contact with a development medium. The exterior surface of a relief printing form has a relief surface with recessed portions and raised elements that have an uppermost surface that carries the ink to transfer and print to the substrate, and as such the exterior surface of the printing form is a printing surface. The printing surface is textured by having a plurality of irregular surface features sufficient to deliver ink from the printing form to the substrate. The textured printing surface provides the printing form with the capability of improved ink transfer, and thus increased ink density of the printed image on a substrate. Texturing of the exterior surface of the printing form is not visible to the eye, and can be determined by examining the printing surface of the raised elements of the printing form using a microscope under magnification, typically with ×420 magnification. Texturing of the printing surface of the printing form is most readily apparent by microscope viewing the uppermost surface of the raised elements that will print ink in solid areas. Generally, texturing appears as a plurality of irregularly-shaped fine line-like shallow disturbances having a maximum length in a given direction of about 10 to 20 microns. While not wanting to be held to a particular theory, it is theorized that the photopolymerizable element having the present styrene-butadiene block copolymer has sufficiently weak crosslinking at the surface due to the inhibiting effect of oxygen during imagewise exposure in the presence of atmospheric oxygen, such that contact during thermal development induces the polymerizable material to form a plurality of irregular fine disturbances in the printing surface of the printing form. The textured surface of the printing form is different from web-marks on the printing form which are induced by the web of development medium. Web marks are generally due to impressions by fibers of a non-woven development medium onto the exterior surface of the photopolymerizable layer. Web marks are visible to the eye and are significantly larger than the texturing of the print surface. For example, web marks can have a length of several 1000 microns, a width of 15 to 30 microns, and are often deep enough to appear in the printed image. The plurality of irregular surface features forming the textured surface of the printing form is not observed in the image printed except by the unexpected improvement in increased ink transfer. Whereas, web-marks on the printing form can be observed in the printed image, and is particularly objectionable when the printed web marks appear in a printed solid area that is smooth and uniform.

Optionally, the photopolymerizable composition can include one or more additional binders with the styrene-butadiene block copolymer having less than 15% by weight of 1,2-coupled bond segments. The additional binder may be selected to provide the photopolymerizable element with other desired mechanical or chemical properties required for its processing and/or end use. In most embodiments the additional binder is an elastomeric binder. In embodiments where the photopolymerizable composition includes an additional binder with the styrene-butadiene block copolymer having less than 15% by weight 1,2 coupled bond segments, the styrene-butadiene block copolymer having less than 15% by weight 1,2 coupled bond segments is greater than 20 weight %, preferably at least 30 weight % of all the components in the photopolymerizable composition. In some embodiments, the additional binder can be a thermoplastic elastomeric block copolymer composed of one or more non-elastomeric blocks of vinyl-substituted aromatic hydrocarbons and one or more elastomeric blocks of an elastomeric block of polybutadiene. Styrene and methylstyrene are examples of suitable vinyl-substituted aromatic hydrocarbons. The additional binder of styrene-butadiene block copolymer can be linear copolymers, radial block copolymers, star block-copolymers, or quasi-radial block copolymers. The additional block copolymer of styrene and butadiene is not particularly limited. In some embodiments, the additional binder includes styrene-butadiene block copolymers having greater than 15 weight % 1,2-coupled unit segments of the polybutadiene block. In this embodiment, the photopolymerizable composition includes less than 30% by weight of the additional binder of styrene-butadiene block copolymers having greater than 15 weight % 1,2-coupled unit segments. In some embodiments where the photopolymerizable composition includes the styrene-butadiene block copolymer having less than 15% by weight 1,2-coupled units and one or more additional styrene-butadiene block copolymers, the weighted average of the 1,2-coupled bond segments in the polybutadiene blocks is less than 15% by weight of the polybutadiene blocks in the two or more styrene-butadiene block copolymers. In yet other embodiments where the photopolymerizable composition includes the styrene-butadiene block copolymer having less than 15% by weight 1,2-coupled units and one or more additional styrene-butadiene block copolymers, the weighted average of the 1,2-coupled bond segments in the polybutadiene blocks can be greater than 15% by weight of the polybutadiene blocks in the two or more styrene-butadiene block copolymers, provided that the elastomeric styrene-butadiene block copolymer having less than 15 weight % 1,2-coupled bond segments is in some instances more than 25% by weight, and in other instances more than 30% by weight, of the photopolymerizable composition.

In other embodiments, the additional binder can be a thermoplastic elastomeric block copolymer composed of one or more non-elastomeric blocks of vinyl-substituted aromatic hydrocarbons and one or more elastomeric blocks of an elastomeric block of polyisoprene. The additional binder of styrene-isoprene block copolymer can be linear copolymers, radial block copolymers, star block-copolymers, or quasi-radial block copolymers. The additional block copolymer of styrene and isoprene is not particularly limited. Other polymeric binders that may be suitable as the additional binder include, but are not limited to, copolymers such as, for example, polystyrene-poly(ethylenebutylene)-polystyrene (SEBS) block copolymer, and polystyrene-poly(ethylene-ethylene propylene)-polystyrene (SEEPS) block copolymer.

Compounds suitable as the at least one ethylenically unsaturated compound (which may also be referred to as a monomer) that can be used in the composition activated by actinic radiation are well known in the art. The ethylenically unsaturated compound includes, but is not limited to, addition-polymerization ethylenically unsaturated compounds having relatively low molecular weights that is, molecular weights generally less than about 30,000, and preferably less than about 5000. Unless described otherwise in the specification, the molecular weight is the weighted average molecular weight. The addition polymerization compound may also be an oligomer, and can be a single or a mixture of oligomers. If a polyacryol oligomer is used, the oligomer should preferably have a molecular weight greater than 1000. The composition can contain a single monomer or a combination of monomers. The monomer compound capable of addition polymerization is present in at least an amount of 5%, preferably 10 to 20%, by weight of the composition.

Suitable monomers include, but are not limited to, acrylate monoesters of alcohols and polyols; acrylate polyesters of alcohols and polyols; methacrylate monoesters of alcohols and polyols; and methacrylate polyesters of alcohols and polyols; where the alcohols and the polyols suitable include alkanols, alkylene glycols, trimethylol propane, ethoxylated trimethylol propane, pentaerythritol, and polyacryol oligomers. Other suitable monomers include acrylate derivatives and methacrylate derivatives of isocyanates, esters, epoxides, and the like. A combination of monofunctional and multi-functional acrylates or methacrylates may be used.

Examples of suitable monomers include, but are not limited to the following: t-butyl acrylate, hexanediol diacrylate, hexanediol dimethyacrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, trimethylolpropane trimethacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl)ether of bisphenol-A, di-(2-methacryloxyethyl)ether of bisphenol-A, di-(3-acryloxy-2-hydroxypropyl)ether of bisphenol-A, di-(2-acryloxyethyl)ether of bisphenol-A, di-(3-methacryloxy-2-hydroxypropyl)ether of tetrachloro-bisphenol-A, di-(2-methacryloxyethyl)ether of tetrachloro-bisphenol-A, di-(3-methacryloxy-2-hydroxypropyl)ether of tetrabromo-bisphenol-A, di-(2-methacryloxyethyl)ether of tetrabromo-bisphenol-A, di-(3-methacryloxy-2-hydroxypropyl)ether of 1,4-butanediol, di-(3-methacryloxy-2-hydroxypropyl)ether of diphenolic acid, triethylene glycol dimethacrylate, polyoxypropyl one trimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, I-phenyl ethylene-1,2-dimethacrylate, pentaerythritol tetramethacrylate, trimethylol propane trimethacrylate, 1,5-pentanediol dimethacrylate, diallyl fumarate, 1,4-benzenediol dimethacrylate, 1,4-diisopropenyl benzene, and 1,3,5-triisopropenyl benzene. Further examples of monomers can be found in Chen U.S. Pat. No. 4,323,636; Fryd et al., U.S. Pat. No. 4,753,865; Fryd et al., U.S. Pat. No. 4,726,877 and Feinberg et al., U.S. Pat. No. 4,894,315.

Another class of monomers includes an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,024, e.g., those having a plurality of addition polymerizable ethylenic linkages particularly when present as terminal linkages. In some embodiments, this class of monomers wherein at least one and preferably most of such linkages are conjugated with a double bonded carbon, including carbon double bonded to carbon and to such heteroatoms as nitrogen, oxygen and sulfur, are suitable. Also suitable are such monomeric materials wherein the ethylenically unsaturated groups, especially the vinylidene groups, are conjugated with ester or amide structures.

The photoinitiator can be any single compound or combination of compounds that is sensitive to actinic radiation to form a species that will initiate either free radical crosslinking and/or polymerization reactions. The photoinitiator for the main or overall exposure (as well as an optional post-exposure and backflash) is sensitive to visible or ultraviolet radiation. Typically the photoinitiator is sensitive to radiation between 310 to 400 nm. A photoinitiator or photoinitiator system that generates free radicals is suitable for use in the present invention. These photoinitiators are particularly effective at capturing the actinic radiation impinging the photosensitive layer and initiating polymerization in the exposed portions of the layer to allow for complete or substantially complete photochemical reinforcement to occur. Compounds suitable as the photoinitiator include, but are not limited to, aromatic ketones, quinones, benzophenones, ketosulphones, thioxanthones, thioxanthrones, 1,2-diketones, aryl ketones, aminoketones, methyl thio phenyl morpholino ketones, morpholino phenyl amino ketones, alpha halogennoacetophenones, oxysulfonyl ketones, sulfonyl ketones, oxysulfonyl ketones, sulfonyl ketones, anthraquinone, fluorenones, xanthones, acetophenone, derivatives of acetophenone, benzoin ethers, benzl ketals, phenylglyoxylates, trimethylbenzoyl phosphine oxide derivatives, camphorquinones, ketocouumarins, and Michler's ketone. Alternatively, the photoinitiator may be a mixture of compounds, one of which provides the free radicals when caused to do so by a sensitizer activated by radiation. The photoinitiator is present in the photosensitive composition in an amount of 0.1 to 15% by weight, based on the weight of the photosensitive composition.

Optionally, the photopolymerizable layer can contain spectral sensitizing agents. In general, spectral sensitizing agents are those materials that absorb radiation at a wavelength different than that of the reaction-initiating component, i.e., photoinitiator, and are capable of transferring the absorbed energy to the photoinitiator. Thus, the wavelength of the activating radiation can be adjusted.

Optionally, a second photoinitiator sensitive to radiation between 220 to 300 nm, preferably 245 to 265 nm, may optionally be present in the photosensitive composition. After thermal treatment to remove unpolymerized portions of the layer, a printing form can be finished with radiation between 220 to 300 nm to detackify the relief surfaces. The second photoinitiator decreases the finishing exposure time necessary to detackify the plate. The second photoinitiator can be effective in photosensitive elements having transmission to actinic radiation of less than 20% since the detackifying reaction occurs at an exterior surface (i.e., contact surface) of the printing form. These optional photoinitiators may be independently present in amounts from 0.001% to 10.0% based on the weight of the photopolymerizable composition.

The photopolymerizable composition can contain other additives depending upon the final properties desired. The additives in the composition should be compatible with the elastomeric binder to the extent that a clear, non-cloudy photopolymerizable layer is produced. Additional additives to the photosensitive layer include plasticizers, colorants, dyes, processing aids, thermal polymerization inhibitors, fillers, antioxidants, and antiozonants. Processing aids may be such things as low molecular weight polymers compatible with the binder, such as low molecular weight alpha-methylstyrene polymer or copolymer. Antiozonants include hydrocarbon waxes, norbornenes, and vegetable oils. In some embodiments it may be desirable to minimize or avoid wax additives in the photopolymerizable composition since the presence of wax in the cured photopolymerizable layer of the printing form can adversely affect transfer of inks, such as water-based inks, to the substrate. It is not necessary to include wax in the composition when an elastomeric styrene-butadiene binder is used. Suitable antioxidants include alkylated phenols, alkylated bisphenols, polymerized trimethyldihydroquinone, and dilauryl thiopropinoate.

Plasticizers can be used to adjust the film forming properties of the elastomeric composition, and can influence the elastomeric hardness of the resulting printing form. Generally, plasticizers are liquids having molecular weights of less than about 5000, but can have molecular weights up to about 30,000, and can sometimes be referred to as oils. Plasticizers may sometimes have monomeric functionality. Examples of plasticizers include aliphatic hydrocarbon oils, e.g., naphthlenic and paraffinic oils; and liquid polydienes, e.g., liquid polybutadienes, liquid isoprenes, acrylated liquid polyisoprenes, and acrylated liquid polybutadienes. Mixtures of plasticizers may be used in the composition. In some embodiments, the plasticizer is a liquid polydiene that has a vinyl content, that is, a content of 1-2 vinyl groups between 0 and 90% by weight. In some embodiments, the liquid polydienes may have a vinyl content, that is, the content of 1-2 vinyl groups of greater than 60 to 90% by weight. Polydienes with relatively high vinyl content, that is the content of 1,2-coupled bond segments greater than 60% by weight of the polydiene, can suitably crosslink with the elastomeric styrene-butadiene binder (having less than 15% by weight of the 1,2-coupled bond segments) which can minimize or eliminate leach out of the plasticizer during printing. The plasticizer can be 0 to 30 weight % of the total of all the components in the photopolymerizable composition. In some embodiments, the plasticizer or oil is from 1 to 30 weight % of the total of the components in the photopolymerizable composition. If the content of the plasticizer is greater than about 30 weight % of the composition, the photopolymerizable layer of the printing precursor can cold flow during storage. Cold flow is the deformation of the photopolymerizable element, in particular the photopolymerizable layer, under its own weight or under a uniform or non-uniform force. Also for printing forms having plasticizer at greater than about 30 weight % of the composition, the plasticizer can leach out from the printing form particularly when printing with solvent-based inks, which can cause the photopolymer layer of the printing form to change durometer and/or thickness which can alter printing quality and is unacceptable to the printer. In most embodiments, the plasticizer is present from 1% to 25% by weight in the photopolymerizable composition. In other embodiments, the plasticizer is present in an amount of 10% to 25% by weight of the photopolymerizable composition.

The thickness of the solid photosensitive layer can vary over a wide range depending upon the type of printing form desired. In one embodiment, the photosensitive layer can have a thickness from about 0.015 inch to about 0.250 inch or greater (about 0.038 to about 0.64 cm or greater), and preferably about 0.020 to 0.155 inch (0.5 mm to 3.9 mm). In another embodiment, the photosensitive layer can have a thickness from about 0.002 inch to 0.025 inch (0.051 to 0.64 mm), and preferably 0.005 to 0.020 inch (0.13 to 0.5 mm).

The photopolymerizable element may optionally include a support adjacent the layer of the photopolymerizable composition. The support can be composed of any material or combination of materials that is conventionally used with photopolymerizable elements used to prepare printing forms. In some embodiments, the support is transparent to actinic radiation to accommodate "backflash" exposure through the support. Examples of suitable support materials include polymeric films such those formed by addition polymers and linear condensation polymers, transparent foams and fabrics, such as fiberglass. Under certain end-use conditions, metals such as aluminum, steel, and nickel, may also be used as a support, even though a metal support is not transparent to radiation. A preferred support is a polyester film; particularly preferred is polyethylene terephthalate film. The support may be in sheet form or in cylindrical form, such as a sleeve. The sleeve can be formed of any material or combination of materials conventionally used in forming sleeves for printing. The sleeve can have a single layer, multi-layer, composite, or unitary structure. Sleeves made of polymeric films are typically transparent to actinic radiation and thereby accommodate backflash exposure for building a floor in the cylindrical printing element. Multiple layered sleeves may include an adhesive layer or tape between the layers of flexible material, such as disclosed in U.S. Pat. No. 5,301,610. The sleeve may also be made of non-transparent, actinic radiation blocking materials, such as nickel or glass epoxy. The sleeve may be composed of one or more layers of a resin composition, which can be the same or different, and have fillers and/or fibers incorporated therein. Materials suitable as the resin composition are not limited, examples of which include, epoxy resins; polystyrene and polyvinyl resins, such as polyvinyl chloride and polyvinyl acetate; phenolic resins; and aromatic amine-cured epoxy resins. The fibers used in the resin composition are not limited and can include, for example, glass fibers, aramid fibers, carbon fibers, metal fibers, and ceramic fibers. Fibers incorporated with the sleeve can include continuous, woven, and/or wound materials. The support formed of a resin composition reinforced with fiber is an example of a composite sleeve. The support typically has a thickness from 0.002 to 0.050 inch (0.0051 to 0.127 cm). A preferred thickness for the sheet form support is 0.003 to 0.016 inch (0.0076 to 0.040 cm). The sleeve can have a wall thickness from about 0.01 and about 6.35 mm or more. In some embodiments, the sleeve has a wall thickness between about 0.25 and 0.80 mm. In some embodiments, the sleeve has a wall thickness between about 10 to 80 mils (0.25 to 2.0 mm), and in other embodiments 10 to 40 mils (0.25 to 1.0 mm). In yet other embodiments, the sleeve has a thickness between about 1 and 3 mm.

Optionally, the element can include an adhesive layer between the support and the photopolymerizable layer, or a surface of the support that is adjacent the photopolymerizable layer has an adhesion-promoting surface. The adhesive layer on the surface of the support can be a subbing layer of an adhesive material or primer or an anchor layer as disclosed in U.S. Pat. No. 2,760,863 to give strong adherence between the support and the photopolymerizable layer. The adhesive compositions disclosed in Burg, U.S. Pat. No. 3,036,913 are also effective. Alternatively, the surface of the support on which the photopolymerizable layer resides can be treated to promote adhesion between the support and the photopolymerizable layer, with flame-treatment or electron-treatment, e.g., corona-treated. Further, the adhesion of the photopolymerizable layer to the support can be adjusted by exposing the element to actinic radiation through the support as disclosed by Feinberg et al. in U.S. Pat. No. 5,292,617.

The photopolymerizable element can be a bi- or multilayer construction, wherein the additional layer/s can be photosensitive (or can become photosensitive), or non-photosensitive. The additional layer/s can have the same, or substantially the same, or different composition as the layer of the photopolymerizable composition. In some embodiments, the photopolymerizable element may include an intermediate layer between a support and a top layer of the photopolymerizable composition. In some embodiments, the intermediate layer may provide the photopolymerizable element with desired bulk properties for end-use as the printing form. For example in one embodiment of photopolymerizable elements for use as flexographic printing forms, the intermediate layer may be an elastomeric non-photosensitive layer that provides the printing form with desired Shore A hardness, resilience, and/or compressibility, and the top layer is the photosensitive layer. The one or more additional layers can undergo the same treatment steps, or can remain unaffected by the treatment steps, that the photopolymerizable layer undergoes.

In one embodiment, the photopolymerizable element includes the support and a layer of the photopolymerizable composition on the support. The composition layer is at least one layer on the substrate capable of being treated to form a relief suitable for printing. In one embodiment, the photosensitive element is an elastomeric printing element suitable for use as a flexographic printing form.

In some embodiments, the photopolymerizable element includes an actinic radiation opaque layer for forming an in-situ mask on the element. In other embodiments, the photopolymerizable element forms an assemblage with a second element that includes an actinic radiation opaque layer for forming an in-situ mask on the element. In most embodiments, the actinic radiation opaque layer is also sensitive to laser radiation which forms the in-situ mask disposed on the photopolymerizable element. Such laser sensitive layer can be employed in digital direct-to-plate image technology in which the exposure by laser radiation removes or transfers the actinic radiation opaque layer to form an in-situ mask on the photopolymerizable element. The radiation opaque layer (i.e., the laser radiation sensitive layer) is typically sensitive to infrared laser radiation, and thus may be identified as an infrared-sensitive layer. The actinic radiation opaque layer can be disposed above a surface of the photopolymerizable layer opposite the support, or can form an assemblage with separate carrier or element that includes the actinic radiation opaque layer. With the exception of traditional silver-halide based materials forming phototools, materials constituting the actinic radiation opaque layer and structures incorporating the actinic radiation opaque layer are not particularly limited, provided that the radiation opaque layer can be imagewise exposed to form the in-situ mask on the photosensitive element and thereby allows for imagewise exposure in the presence of atmospheric oxygen. The actinic radiation opaque layer may substantially cover the surface or only cover an imageable portion of the photopolymerizable layer. The actinic radiation opaque layer is substantially opaque to actinic radiation that corresponds with the sensitivity of the photopolymerizable material. The actinic radiation opaque layer can be used with or without a barrier layer. If used with the barrier layer, the barrier layer is disposed between the photopolymerizable layer and the radiation opaque layer. If present, the barrier layer minimizes migration of materials between the photopolymerizable layer and the radiation opaque layer. Monomers and plasticizers can migrate over time if they are compatible with the materials in an adjacent layer, which can alter the laser radiation sensitivity of the radiation opaque layer or can cause smearing and tackifying of the radiation opaque layer after imaging. The radiation opaque layer preferably is removable by contact with a development medium in the range of acceptable developing temperatures for the photosensitive element used.

The actinic radiation opaque layer is also sensitive to laser radiation that can selectively remove or transfer the opaque layer and form the in-situ mask. In one embodiment, the actinic radiation opaque layer is sensitive to infrared laser radiation. In some embodiments, the actinic radiation opaque layer includes a radiation-opaque material, an infrared-absorbing material, and an optional binder. In other embodiments, the actinic radiation opaque layer includes a binder and one material suitable to function as both a radiation opaque material and an infrared sensitive material. Dark inorganic pigments, such as carbon black and graphite, mixtures of pigments, metals, and metal alloys generally function as both infrared-sensitive material and radiation-opaque material. The optional binder is a polymeric material which includes, but is not limited to, self-oxidizing polymers, non-self-oxidizing polymers, thermochemically decomposable polymers, polymers and copolymers of butadiene and isoprene with styrene and/or olefins, pyrolyzable polymers, amphoteric interpolymers, polyethylene wax, materials conventionally used as the release layer described above, and combinations thereof. The thickness of the actinic radiation opaque layer should be in a range to optimize both sensitivity and opacity, which is generally from about 20 Angstroms to about 50 micrometers. The actinic radiation opaque layer should have a transmission optical density of greater than 2.0 in order to effectively block actinic radiation and the polymerization of the underlying photopolymerizable layer.

In one embodiment, the photopolymerizable element includes the actinic radiation opaque layer that is disposed above and covers or substantially covers the entire surface of the photopolymerizable layer. In this case the infrared laser radiation imagewise removes, i.e., ablates or vaporizes, the radiation opaque layer to form the in-situ mask. Suitable materials and structures for this actinic radiation opaque layer are disclosed by Fan in U.S. Pat. No. 5,262,275; Fan in U.S. Pat. No. 5,719,009; Fan in U.S. Pat. No. 6,558,876; Fan in EP 0 741 330 A1; and Van Zoeren in U.S. Pat. Nos. 5,506,086 and 5,705,310. A material capture sheet adjacent the radiation opaque layer may be present during laser exposure to capture the material as it is removed from the photosensitive element as disclosed by Van Zoeren in U.S. Pat. No. 5,705,310. Only the portions of the radiation opaque layer that were not removed from the photosensitive element will remain on the element forming the in-situ mask.

In another embodiment, the photopolymerizable element will not initially include the actinic radiation opaque layer. A separate element bearing the radiation opaque layer will form an assemblage with the photosensitive element such that the radiation opaque layer is adjacent the surface of the photosensitive element opposite the support, which is typically is the photopolymerizable layer. (If present, a coversheet associated with the photosensitive element typically is removed prior to forming the assemblage.) The separate element may include one or more other layers, such as ejection layers or heating layers, to aid in the digital exposure process. Hereto, the radiation opaque layer is also sensitive to infrared radiation. The assemblage is exposed imagewise with infrared laser radiation to selectively transfer or selectively alter the adhesion balance of the radiation opaque layer and form the image on or disposed above the photopolymerizable layer. The separate element may be peeled or lifted away from the photosensitive element to reveal the in-situ mask. Materials and structures suitable for this actinic radiation opaque layer are disclosed by Fan et al. in U.S. Pat. No. 5,607,814; and Blanchett in U.S. Pat. Nos. 5,766,819; 5,840,463; and EP 0 891 877A. As a result of the imagewise transfer process, only the transferred portions of the radiation opaque layer will reside on the photosensitive element forming the in-situ mask.

It is also contemplated that digital mask formation can be accomplished by imagewise application of the radiation opaque material in the form of inkjet inks. Imagewise application of an ink-jet ink can be directly on the photopolymerizable layer or disposed above the photopolymerizable layer on another layer of the photosensitive element.

The photopolymerizable element may include one or more additional layers on or adjacent the photopolymerizable layer. In most embodiments the one or more additional layers are on a side of the photosensitive layer opposite the support, and between the photopolymerizable layer and the actinic radiation opaque layer. Examples of additional layers include, but are not limited to a capping layer, an elastomeric layer, a release layer, a barrier layer, and combinations thereof. The one or more additional layers can be removable, in whole or in part, during treatment. One or more of the additional layers may cover or only partially covers the photopolymerizable layer. An example of an additional layer which only partially covers the photopolymerizable layer is a masking layer that is formed by imagewise application, e.g., ink jet application, of an actinic radiation blocking material or ink.

The release layer protects the surface of the composition layer and enables the easy removal of a coversheet from the photosensitive element. Materials suitable as the release layer are well known in the art.

Suitable compositions for the capping layer and methods for forming the layer on the element are disclosed as elastomeric compositions in a multilayer cover element described in Gruetzmacher et al., U.S. Pat. Nos. 4,427,759 and 4,460,675. The elastomeric capping layer is similar to the photosensitive layer in that after imagewise exposure the elastomeric capping layer is at least partially removable by treating. The elastomeric capping layer includes an elastomeric binder, which should include at least 30% by weight of the styrene-butadiene elastomeric binder described above in order to exhibit the improvement in printing and ink density, and optionally, one or more monomers, photoinitiator or photoinitiator system, and other additives as described for the photosensitive layer. The elastomeric layer or capping layer can be photosensitive itself, that is, contain monomer and initiator, or it can become photosensitive when in contact with the photopolymerizable layer. The composition of the elastomeric capping layer can be the same as, or substantially the same as, or different from the composition of the adjacent photopolymerizable layer. The elastomeric capping layer is solid that generally forms a monolithic structure with the adjacent photopolymerizable layer. The thickness of the elastomeric capping layer is typically between about 0.001 inch to about 0.010 inch (0.025 to 0.25 mm).

The photopolymerizable element of the present invention may further include a temporary coversheet on top of the uppermost layer of the photopolymerizable element. One purpose of the coversheet is to protect the uppermost layer of the photopolymerizable element during storage and handling. Depending upon end use, the coversheet may or may not be removed prior to imaging, but is removed prior to development. Suitable materials for the coversheet are well known in the art.

The photosensitive composition can be prepared by employing a variety of techniques that are well known in the art. One method which can be used is to mix the components (that is, binder, photoinitiator, monomer and other ingredients) in an extruder and then extrude the mixture as a hot melt onto a support. It is preferred that the extruder be used to perform the functions of melting, mixing, deaerating, and filtering the composition. To achieve uniform thickness, the extrusion step can be advantageously coupled with a calendering step in which the hot mixture is calendered between two sheets or between one flat sheet and a release roll. Alternately, the material can be extruded and calendered onto a temporary support and later laminated to the desired final support. The elements can also be prepared by compounding the components in a suitable mixing device and then pressing the material into the desired shape in a suitable mold. The material is generally pressed between the support and the coversheet. The molding step can involve pressure and/or heat. The coversheet may include one or more of the additional layers which transfer to the photopolymerizable layer when the photopolymerizable element is formed.

The present method includes imagewise exposing the photopolymerizable element to actinic radiation in the presence of atmospheric oxygen; heating the element to a temperature sufficient to cause a portion of the layer to liquefy; and contacting an exterior surface of the photopolymerizable element with a development medium to allow at least a portion of the liquefied layer to be removed by the development medium.

In preparation for imagewise exposing the photopolymerizable element to actinic radiation, the mask image will need to be formed on or disposed above the surface of the photopolymerizable layer opposite the support. The mask includes opaque areas and "clear" areas that form the image. The opaque areas of the mask prevent the photopolymerizable material beneath from being exposed to the radiation and hence those areas of the photopolymerizable layer covered by the dark areas do not polymerize. The "clear" areas of the mask expose the photopolymerizable layer to actinic radiation and polymerize or crosslink. Direct-to-plate or digital methods create a mask image in situ on or disposed above the photopolymerizable layer with laser radiation. In most embodiments, the actinic radiation opaque layer forms the in situ mask image. Generally, digital methods of in situ mask formation either selectively remove or transfer the radiation opaque layer, from or to a surface of the photopolymerizable element opposite the support. In most embodiments, the radiation opaque layer is also sensitive to infrared radiation so that the digital methods for forming the mask image can be conducted with the preferred infrared laser radiation. For direct-to-plate image formation as disclosed in U.S. Pat. Nos. 5,262,275; 5,719,009; 5,607,814; 5,506,086; 5,766,819; 5,840,463; 6,238,837; 6,558,876; and 6,773,859 the image-bearing mask is formed in-situ with the laser radiation sensitive layer using an infrared laser exposure engine.

The imagewise infrared laser exposure can be carried out using various types of infrared lasers, which emit in the range 750 to 20,000 nm. Infrared lasers including, diode lasers emitting in the range 780 to 2,000 nm and Nd:YAG lasers emitting at 1064 nm are preferred. The in situ mask image remains on the photopolymerizable element for subsequent steps of overall exposure to actinic radiation through the in-situ mask and thermal treating.

It is also contemplated that in-situ digital mask formation can be accomplished by imagewise application of the radiation opaque material in the form of inkjet inks. Imagewise application of an ink-jet ink can be directly on the photopolymerizable layer or disposed above the photopolymerizable layer on another layer of the photosensitive element.

Another contemplated method for forming the in-situ mask is by creating the mask image of the radiation opaque layer on a separate carrier and then transferring with application of heat and/or pressure to the surface of the photopolymerizable layer opposite the support. The photopolymerizable layer is typically tacky and will retain the transferred image. The separate carrier can then be removed from the element prior to imagewise exposure. The separate carrier may have a radiation opaque layer that is cable of forming an image upon imagewise exposure to laser radiation to selectively remove the radiation opaque material. The next step of the method to prepare a relief printing form is to overall expose the photopolymerizable element to actinic radiation through the in-situ mask, that is, imagewise exposure of the element. The photopolymerizable element is imagewise exposed to actinic radiation through the in-situ mask in the presence of atmospheric oxygen. Conventional digital workflow methods imagewise expose the photosensitive element to actinic radiation in air, which is 78% nitrogen, ~21% oxygen, <1% each argon and carbon dioxide, and trace amounts of other gases. As such for the present invention, the imagewise exposure in the presence of atmospheric oxygen is an imagewise exposure in air in which the concentration of oxygen is about 21% (210,000 ppm). After imagewise exposure, the photosensitive element contains cured portions in the exposed areas of the radiation curable composition layer and uncured portions in the unexposed areas of the radiation curable composition layer. Imagewise exposure is conducted in the presence of atmospheric oxygen. On exposure, the transparent areas of the mask allow addition polymerization or crosslinking to take place, while the actinic radiation opaque areas remain uncrosslinked. Exposure is of sufficient duration to crosslink the exposed areas down to the support or to a back exposed layer (floor). Imagewise exposure time is typically much longer than backflash time, and ranges from a few to tens of minutes. The photopolymerizable printing element has excellent exposure latitude, in that the very small highlight form readily before reverse fill-in. Actinic radiation sources encompass the ultraviolet and visible wavelength regions. The suitability of a particular actinic radiation source is governed by the photosensitivity of the initiator and the at least one monomer in photopolymerizable element. The preferred photosensitivity of most common photopolymerizable elements used as precursors to the printing forms is in the UV and deep visible area of the spectrum, as they afford better room-light stability. The portions of the composition layer that are exposed to radiation chemically cross-link and cure. The portions of the composition layer that are unirradiated (unexposed) are not cured and have a lower melting or liquefying temperature than the cured irradiated portions. The imagewise exposed photosensitive element is then ready for treatment to remove unpolymerized areas in the photopolymerizable layer and thereby form a relief image areas of the image.

An overall back exposure through the support side, a so-called backflash exposure, may be conducted to polymerize a predetermined thickness of the photopolymer layer adjacent the support. The backflash exposure may be conducted before, after, or even during other imaging steps, the imagewise exposure. This polymerized portion of the photopolymer layer is designated a floor. The floor provides improved adhesion between the photopolymerizable layer and the support, helps highlight dot resolution and also establishes the depth of the plate relief. The floor thickness varies with the time of exposure, exposure source, etc. This exposure may be done diffuse or directed. All radiation sources suitable for imagewise exposure may be used. The exposure is generally for 10 seconds to 30 minutes.

Following overall exposure to UV radiation through the mask, the photopolymerizable printing element is treated to remove unpolymerized areas in the photopolymerizable layer and thereby form a relief image. The treating step removes at least the photopolymerizable layer in the areas which were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerized areas of the photopolymerizable layer. The thermal treating step also removes the in-situ mask image (which had been exposed to actinic radiation) and the underlying unexposed areas of the photopolymerizable layer.

Treatment of the photopolymerizable element includes "dry" development wherein the photosensitive element is heated to a development temperature which causes the unpolymerized areas of the photopolymerizable layer to liquefy, i.e., melt or soften or flow, and then are removed. Dry development may also be called thermal development, or thermal treating.

Thermal treating the element includes heating the photopolymerizable element having at least one photopolymerizable layer (and the additional layer/s) to a temperature sufficient to cause the uncured portions of the photopolymerizable layer to liquefy, i.e., soften or melt or flow, and removing the uncured portions. The layer of the photosensitive composition is capable of partially liquefying upon thermal development. That is, during thermal development the uncured composition must soften or melt at a reasonable processing or developing temperature. If the photopolymerizable element includes one or more additional layers on the photopolymerizable layer, it is preferred that the one or more additional layers are also removable in the range of acceptable developing temperatures for the photopolymerizable layer. The polymerized areas (cured portions) of the photopolymerizable layer have a higher melting temperature than the unpolymerized areas (uncured portions) and therefore do not melt, soften, or flow at the thermal development temperatures. The uncured portions can be removed from the cured portions of the composition layer by contacting with an absorbent material as described in U.S. Pat. Nos. 3,060,023; 3,264,103; 5,015,556; 5,175,072; 5,215,859; 5,279,697; and 6,797,454. A preferred method for removing the uncured portions is by contacting an outermost surface of the photopolymerizable element to an absorbent surface, such as a development medium, to absorb or wick away or blot the liquefied portions.

The term "melt" is used to describe the behavior of the unirradiated (uncured) portions of the composition layer subjected to an elevated temperature that softens and reduces the viscosity to permit absorption by the absorbent material. The material of the meltable portion of the composition layer is usually a viscoelastic material which does not have a sharp transition between a solid and a liquid, so the process functions to absorb the heated composition layer at any temperature above some threshold for absorption in the development medium. Thus, the unirradiated portions of the composition layer soften or liquefy when subjected to an elevated temperature. However throughout this specification the terms "melting", "softening", and "liquefying" may be used to describe the behavior of the heated unirradiated portions of the composition layer, regardless of whether the composition may or may not have a sharp transition temperature between a solid and a liquid state. A wide temperature range may be utilized to "melt" the composition layer for the purposes of this invention. Absorption may be slower at lower temperatures and faster at higher temperatures during successful operation of the process.

The thermal treating steps of heating the photopolymerizable element and contacting an outermost surface of the element with development medium can be done at the same time, or in sequence provided that the uncured portions of the photopolymerizable layer are still soft or in a melt state when contacted with the development medium. The at least one photopolymerizable layer (and the additional layer/s) are heated by conduction, convection, radiation, or other heating methods to a temperature sufficient to effect melting of the uncured portions but not so high as to effect distortion of the cured portions of the layer. The one or more additional layers disposed above the photopolymerizable layer may soften or melt or flow and be absorbed as well by the development medium. The photosensitive element is heated to a surface temperature above about 40° C., preferably from about 40° C. to about 230° C. (104-446° F.) in order to effect melting or flowing of the uncured portions of the photopolymerizable layer. By maintaining more or less intimate contact of the development medium with the photopolymerizable layer that is molten in the uncured regions, a transfer of the uncured photosensitive material from the photopolymerizable layer to the development medium takes place. While still in the heated condition, the development medium is separated from the cured photopolymerizable layer in contact with the support layer to reveal the relief structure. A cycle of the steps of heating the photopolymerizable layer and contacting the molten (portions) layer with the development medium can be repeated as many times as necessary to adequately remove the uncured material and create sufficient relief depth. However, it is desirable to minimize the number of cycles for suitable system performance, and typically the photopolymerizable element is thermally treated for 5 to 15 cycles. Intimate contact of the development medium to the photopolymerizable layer (while in the uncured portions are melt) may be maintained by the pressing the layer and the development medium together.

Apparatuses suitable for thermally developing the photopolymerizable element are disclosed by Peterson et al. in U.S. Pat. No. 5,279,697, and also by Johnson et al. in U.S. Pat. No. 6,797,454. The photopolymerizable element in all embodiments is in the form of a plate. However, it should be understood that one of ordinary skill in the art could modify each of the disclosed apparatuses to accommodate the mounting of the photopolymerizable element in the form of a cylinder or a sleeve.

The development medium is selected to have a melt temperature exceeding the melt or softening or liquefying temperature of the unirradiated or uncured portions of the radiation curable composition and having good tear resistance at the same operating temperatures. Preferably, the selected material withstands temperatures required to process the photosensitive element during heating. The development medium may also be referred to herein as development material, absorbent material, absorbent web, and web. The development medium is selected from non-woven materials, paper stocks, fibrous woven material, open-celled foam materials, porous materials that contain more or less a substantial fraction of their included volume as void volume. The development medium can be in web or sheet form. The development medium should also possess a high absorbency for the molten elastomeric composition as measured by milligrams of elastomeric composition that can be absorbed per square centimeter of the development medium. It is also desirable that fibers are bonded in development mediums containing fibers so that the fibers are not deposited into the form during development. In some embodiments, the development medium is a non-woven material. In other embodiments, the development medium is non-woven web of nylon or polyester.

After the treatment step, the photopolymerizable element is essentially a printing form having relief surface of raised elements and recessed areas. The exterior printing surface of the printing form exhibits the texturing, particularly on uppermost surface of the raised elements for solid area printing, which is sufficient to be observed under magnification. The texture of the print surface can be stabilized by post-exposure of the thermally treated photopolymerizable element to actinic radiation. Post-exposure of the photopolymerizable element is an overall exposure to actinic radiation to ensure that the photopolymerization process is complete and that the so formed flexographic printing plate will remain stable during printing and storage. This post-exposure step can utilize the same radiation source as the imagewise main exposure. Furthermore, if the surface of the flexographic printing plate is still tacky, detackification treatments may be applied. Such methods, which are also called "finishing", are well known in the art. For example, tackiness can be eliminated by a treatment of the flexographic printing plate with bromine or chlorine solutions. Preferably, detackification is accomplished by exposure to UV radiation sources having a wavelength not longer than 300 nm, typically between 200 and 300 nm. This so-called "light-finishing" is disclosed in European Published Patent Application 0 017927 and U.S. Pat. No. 4,806,506. The texture of the print surface may be further stabilized by light-finishing the thermally treated photopolymerizable element to radiation less than 300 nm. Various finishing methods may also be combined. Typically, the post-exposure and the finishing exposure are done at the same time on the photopolymerizable element using an exposure device that has both sources of radiation. In the present invention, the post-exposure and/or the finishing exposure complete the polymerization of the polymeric material forming textured printing surface of the printing form, and thereby ensure the capability of the printing form to provide increase ink transfer.

Printing forms (i.e., photopolymerizable element that has been exposed and processed) prepared according to the present method can have a durometer of about 40 to 70 Shore A. Durometer is one of several ways to indicate the hardness of a material, and is defined as the resistance of a material to permanent indentation. Durometer measures the depth of an indentation in a material (typically specified as having a 0.25 inch thickness) by a given force on a standardized presser foot. There are several scales of durometer, of which the Shore A scale is typically used for softer plastics. Each scale results in a value between 0 and 100, with higher values indicating a harder material. Shore A durometer is also typically used to characterize elastomeric printing precursors and printing forms. However, in some instances printing forms are not available at the specified thickness of 0.25 inch (0.64 cm) used for Shore A durometer measurements. So the measurement of the Shore A durometer is often conducted on readily available printing forms having on 67 mil (0.067 inch) (0.17 cm) thickness (that is, the thickness of the photopolymerizable layer and the support). In some embodiments, the printing form (having a total thickness of the photopolymerizable layer and the support of 67 mil) has a durometer of about 50 to 80 Shore A. In some embodiments, the durometer of the printing form having 67 mil thickness is between 50 and 65 Shore A. In other embodiments, the durometer of the printing form 65 and 80 Shore A. The Shore A durometer can be measured, for example, using a Shore Durometer Hardness Gauge Type "A-2" manufactured by The Shore Instrument & Manufacturing Company, Inc. (Jamaica, N.Y., USA). Other instruments for measuring Shore A durometer are readily available and are well known to those of ordinary skill in the art.

Although the present method is focused on preparing a printing form from a precursor of the photopolymerizable element having the particular elastomeric binder and using digital workflow and thermal development, it is contemplated that the printing form may be prepared from the photopolymerizable element by other alternate conventional method steps, such as, solution development instead of thermal treatment, and/or analog workflow using a phototool instead of digital workflow using an in-situ mask, and/or by photochemical reinforcement and laser engraving to form the relief pattern.

EXAMPLES

In the following examples, all percentages are by weight unless otherwise noted. CYREL® photopolymerizable printing plates, CYREL® Digital Imager, CYREL® exposure unit, CYREL® processor, and CYREL® CYLOSOL developing solution are all available from The DuPont Company (Wilmington, Del.).

Glossary

| Identifier | Ingredient | Manufacturer/ Supplier |
| --- | --- | --- |
| KX405 | Linear poly(styrene-butadiene-styrene) having diblock content of <1 wt. % and styrene content of about 24 wt. % (based on weight of binder); a 1,2-coupled butadiene content of 9 wt. % (based on the weight of the butadiene block); and a molecular weight of 129,000. | Kraton Polymers |
| D1192 | Linear poly(styrene-butadiene-styrene) having diblock content of <1 wt. % and styrene content of about 30 wt. % (based on weight of binder); a 1,2-coupled butadiene content of 37 wt. % (based on the weight of the butadiene block); and a molecular weight of 141,000. | Kraton Polymers |
| Nisso PB1000 | Liquid poly1,2 butadiene oil having >85% vinyl content (1,2 bonding content) | Nippon Soda |
| HMDA | Hexanediol diacrylate | Sartomer |
| HMDMA | Hexanediol dimethacrylate | Sartomer |
| Photoinitiator | 2-phenyl 2,2-dimethyl oxyacetophenone | Ciba |
| Esacure TZT | Photoinitiator which is a eutectic mixture of 2,4,6-trimethylbenzophenone (CAS 954-16-5) and 4-methylbenzophenone (CAS 134-84-9) | Sartomer |

Example 1

A photopolymerizable mixture of about 64.8% of KX405, 20% of Nisso PB-1000, 7.48% of HMDA, 3.5% of HMDMA, 0.5% of Esacure TZT, 2.7% of the photoinitiator, and 1.02% of conventional additives (i.e., an antioxidant, a thermal inhibitor, a colorant dye, and uv absorbing dye) were mixed. The mixture was extruded and calendered to form a photopolymerizable element having a photopolymerizable layer between two polyethylene terephthalate films, which were a 5 mil (0.013 cm) support and a 4 mil (0.010 cm) coversheet. The coversheet included an actinic radiation opaque layer which was positioned adjacent the photopolymerizable layer. The total thickness of the element was 71 mils (0.180 cm) with the coversheet (i.e., 67 mil (0.170 cm) photopolymer and support). The actinic radiation opaque layer included 67 wt. % of Macromelt® 6900 polyamide as a binder and 33 wt. % of carbon black. The element was cut into several samples.

Three samples of Example 1 were exposed to ultraviolet radiation at 365 nm for 70 seconds (1.2 Joules/cm$^2$) through the support side of the samples to form the floor. The three samples were then imaged using a CYREL® Digital Imager infrared laser radiation exposure unit (CDI Spark 4835 made by Esko Graphics Imaging GmbH having Nd:YAG laser (light wavelength output at 1064 nm) at 3.0 Joules/cm$^2$ of energy to selectively remove the actinic radiation opaque layer and form the in-situ mask image on the photopolymerizable layer. The three samples of Example 1 were exposed through the in-situ mask to ultraviolet radiation at 365 nm for 8 minutes (8.1 Joules/cm$^2$) on a CYREL® exposure unit. All three of the exposed samples were processed through a CYREL®FAST TD1000 thermal processor at standard conditions for 67 mil plates. All three samples were thermally treated under the same conditions. The development medium was polyester nonwoven. A cycle (or pass) of the printing element is essentially one rotation of the drum in the thermal processor which constituted heating the element, contacting the element with a web of a development medium to remove unpolymerized portions, and separating the development medium from the element. The element was oriented on a support drum of the apparatus such that the imagewise exposed surface of the photopolymerizable element (i.e., exterior surface that is opposite the support side of the photopolymerizable element) contacted the development medium during thermal treatment. Thermal treatment by heating and contacting removed the unexposed areas and created a printing form having a relief surface of the image. The conditions for thermal development were as follows:

| Thermal Development Conditions Example 1 | | | |
| --- | --- | --- | --- |
| Hot roll Temperature | 335° F. | Chiller Temperature | 74° F. |
| Drum Temperature | 75° F. | Pressure (at nip) | 71 pounds per linear inch |
| Cycle | Pressure | Speed (ipm*) | IR (% Power) |
| 1 | 100% | 35 | 80 |
| 2 | 100% | 35 | 50 |
| 3 | 90% | 40 | 50 |
| 4 | 90% | 40 | 50 |
| 5 | 90% | 45 | 50 |
| 6 | 80% | 50 | 40 |
| 7 | 80% | 50 | 40 |
| 8 | 70% | 50 | 40 |
| 9 | 70% | 50 | 40 |
| 10 | 60% | 50 | 20 |

*ipm is inch per minute

After thermal processing, one of the exposed and thermally processed samples (Sample A) was not post-exposed and light finished.

After thermal processing, the other of the exposed and thermally processed samples (Sample B) was first wiped with a cloth having Film Kleen® antistatic film cleaner, which is a solvent cleaner used in the printing industry for cleaning film, glass, or other smooth surfaces of dirt and dust, by gently rubbing the exterior surface of the plate and then placing the sample in the room to air dry. Then Sample B was post exposed (to ultraviolet radiation at 365 nm) and light finished (to ultraviolet radiation at 250 nm) on the CYREL® exposure unit for 2 minutes and 3 minutes, respectively.

After thermal processing, one of the exposed and thermally processed samples (Sample C) was first post-exposed and light finished at the same conditions used for Sample B, and then Sample C was wiped with a cloth having the Film Kleen® in the same manner as Sample B.

The surface opposite the support, i.e., exterior surface or printing surface, of all three plate samples was examined using a digital microscope with ×420 magnification. Samples were analyzed at a center of solid printing areas sized at least 0.5 inch by 0.5 inch. The digital microscope used was a Hirox KH-7700 (from Hirox-USA Inc., River Edge, N.J.) that was equipped with MXG-10C zoom lens and OL-140 objective lens.

Example 1

| Sample | Conditions | Observation of Print Surface |
| --- | --- | --- |
| Sample A | Thermally processed, no post exposure or light finishing | Textured |
| Sample B | Thermally processed, wiped with solvent cloth, and then post-exposed and light finished | No texture |
| Sample C | Thermally processed, post-exposed and light finished, and then wiped with solvent cloth | Textured |

The results demonstrated that the process of preparing a printing form according to the present invention, which includes the steps of imagewise exposing of the photopolymerizable layer in the presence of atmospheric oxygen and thermally developing, creates a texturing effect on the print surface. The texturing effect on the print surface was observed immediately after thermal treating, and was retained on the surface after post-exposure and light finishing steps. Wiping of the printing surface with the solvent cloth after post-exposure and finishing did not remove the texture effect on the print surface. The texturing effect on the print surface was removed by wiping the surface with a solvent cloth prior to post-exposure and light finishing.

Example 2

Additional samples of the photopolymerizable element prepared above for Example 1 were prepared into a printing form and printed. All Samples were exposed as described above. Samples D1 and D2 were thermally treated, and then post-exposed and light finished as described above for Sample C, except no wiping with solvent was done after post-exposure and light finishing. Samples E1 and E2 were thermally treated, the print surface wiped with a solvent cloth, and then post-exposed and light-finished as described above for Sample B. Samples F1 and F2 were wet processed, i.e., wash out, with CYLOSOL solvent, at 97° F. (36.1° C.), for 7 minutes, in a 1000P processor, and then dried for 2 hours at 133.7° F. (56.5° C.) in a 2001LF dryer. Samples F1 and F2 were post-exposed and light finished as were done for Samples D1, D2 and E1, E2. The print surface of all the Samples was examined using a digital microscope as described above. It should be noted that samples D1 and D2 exhibited predominately a textured surface with some very light web-marks, which the web-marks did not transfer to or appear in the images printed.

The samples were used to print using a PCMC Avanti Central Impression flexographic printing press equipped with a Stork 800/2.4 anilox roll at 700 ft/min using 3M 1920 tape, Bemis Milprint 1.5 mil white PE film substrate, and SunChemical—polyamide magenta ink with a kiss plus 2 mil impression. Print density was read in solid areas using a Greytag MacBeth SprectroScan reflection densitometer. The average and standard deviation of the print density was reported based on a number of solid area locations, n, in the following table.

| Sample | Conditions | Microscopic Surface Analysis | Print Density Analysis | | |
|--------|-----------|------------------------------|---|---------|----------|
|        |           |                              | n | Average | Standard Deviation |
| D1 | Thermally processed, post-exposed and light finished | Textured | 36 | 1.13 | .02 |
| D2 | | Textured | 36 | 1.12 | .02 |
| E1 | Thermally processed, wiped with solvent cloth, and then post-exposed and light finished | No texture | 36 | 1.05 | .02 |
| E2 | | No texture | 36 | 1.06 | .02 |
| F1 | Solvent processed, and post-exposed and light finished | No texture | 36 | 1.06 | .02 |
| F2 | | No texture | 36 | 1.07 | .03 |

The test results demonstrated that the printing forms, Samples D1 and D2, having a textured surface as observed with the digital microscope, printed with a higher density of the ink onto the substrate than the Samples E1, E2 and F1 and F2 in which no texture of the printing surface was observed.

Example 3

A photopolymerizable mixture of about 64.1% of KX405, 20% of Nisso PB-1000, 8.9% of HMDA, 2.8% of TMPTMA, 2.7% of the photoinitiator, and 1.5% of conventional additives (i.e., an antioxidant, a thermal inhibitor, and colorant dye) were mixed. The mixture was extruded and calendered to form a photopolymerizable element having a photopolymerizable layer between two polyethylene terephthalate films, which were a 5 mil (0.013 cm) support and a 4 mil (0.010 cm) coversheet. The coversheet included an actinic radiation opaque layer which was positioned adjacent to the photopolymerizable layer. The total thickness of the element was 71 mils (0.180 cm) with the coversheet (i.e., 67 mil (0.170 cm) photopolymer and support). The actinic radiation opaque layer included 67 wt. % of Macromelt® 6900 polyamide as a binder and 33 wt. % of carbon black. The element was cut into two samples (G1 and G2).

A comparative photopolymerizable mixture of about 64.1% of D1192, 20% of Nisso PB-1000, 8.9% of HMDA, 2.8% of TMPTMA, 2.7% of the photoinitiator, and 1.5% of conventional additives (i.e., an antioxidant, a thermal inhibitor, and colorant dye) were mixed. The mixture was extruded and calendered to form a photopolymerizable element having a photopolymerizable layer between two polyethylene terephthalate films, which were a 5 mil (0.013 cm) support and a 4 mil (0.010 cm) coversheet. The coversheet included an actinic radiation opaque layer which was positioned adjacent to the photopolymerizable layer. The total thickness of the element was 71 mils (0.180 cm) with the coversheet (i.e., 67 mil (0.170 cm) photopolymer and support). The actinic radiation opaque layer included 67 wt. % of Macromelt® 6900 polyamide as a binder and 33 wt. % of carbon black. This element was cut into two samples (H1 and H2).

The four samples of Example 3 were exposed to ultraviolet radiation at 365 nm for 70 seconds (1.2 Joules/cm$^2$) through the support side of the samples to form the floor. The samples were then imaged using a CYREL® Digital Imager infrared laser radiation exposure unit CDI Spark 2530 made by Esko Graphics Imaging GmbH having Nd:YAG fiber laser (light wavelength output at 1074 nm) at about 3 Joules/cm$^2$ of energy to selectively remove the actinic radiation opaque layer and form the in-situ mask image on the photopolymerizable layer. The samples of Example 2 were exposed through the in-situ mask to ultraviolet radiation at 365 nm for 8 minutes (8.1 Joules/cm$^2$) on a CYREL® 2001E exposure unit.

Two of the exposed samples (G1 and H1) were processed through a CYREL®FAST TD1000 thermal processor using the thermal conditions shown in Example1. The other two exposed samples (G2 and H2) were processed in a CYREL®FAST TD1000 thermal processor using different thermal condition shown below.

| Thermal Development Conditions Example 3 | | | |
|---|---|---|---|
| Hot roll Temperature | 335° F. | Chiller Temperature | 74° F. |
| Drum Temperature | 75° F. | Pressure (at nip) | 71 pounds per linear inch |

| Cycle | Pressure | Speed (ipm*) | IR (% Power) |
|-------|----------|--------------|--------------|
| 1  | 100% | 25 | 80 |
| 2  | 100% | 30 | 80 |
| 3  | 90%  | 30 | 80 |
| 4  | 90%  | 30 | 70 |
| 5  | 90%  | 30 | 70 |
| 6  | 80%  | 35 | 70 |
| 7  | 80%  | 35 | 60 |
| 8  | 70%  | 40 | 60 |
| 9  | 70%  | 40 | 60 |
| 10 | 60%  | 40 | 60 |
| 11 | 60%  | 40 | 50 |

*ipm is inch per minute

The development medium was polyester nonwoven. A cycle (or pass) of the printing element (or sample) is essentially one rotation of the drum in the thermal processor which constituted heating the element, contacting the element with a web of a development medium to remove unpolymerized portions, and separating the development medium from the element. The element was oriented on a support drum of the apparatus such that the imagewise exposed surface of the photopolymerizable element (i.e., exterior surface that is opposite the support side of the photopolymerizable element) contacted the development medium during thermal treatment. Thermal treatment by heating and contacting removed the unexposed areas and created a printing form having a relief surface of the image.

After thermal processing, all samples were post exposed (to ultraviolet radiation at 365 nm) and light finished (to ultraviolet radiation at 250 nm) on the CYREL® Finish/Post Exposure unit for 5 minutes and 10 minutes, respectively.

The surface opposite the support, i.e., exterior surface or printing surface, of all four plate samples was examined using a digital microscope with ×420 magnification. Samples were analyzed at a center of solid printing areas sized at least 0.5 inch by 0.5 inch. The digital microscope used was a Hirox KH-7700 (from Hirox-USA Inc., River Edge, N.J.) that was equipped with MXG-10C zoom lens and OL-140 objective lens. The surface was classified as either no texture (smooth), textured (predominately textured surface, which may include some very light web-marks), or web marks (predominately web marks with little textured surface).

The four samples were printed using a Mark Andy 830 flexographic printing press equipped with a 1.2 BCM 1000 line anilox roll at 180 ft/min using 3M 1920 tape, Fasson 2.6M white biaxially-oriented polypropylene TC/5246/40# substrate, and Sun Chemical Aquaverse Pro Cyan ink with 4 inch pounds of impression torgue. Print density was read in solid areas using a X-Rite 500 Series Spectrodensitometer. The test results are reported in the following table.

| Sample | Binder Description Name | 1,2 Vinyl % | Thermal Processing Conditions | Observed Print Surface | Print Density Analysis | | |
|---|---|---|---|---|---|---|---|
| | | | | | n | Ave | Std. dev |
| G1 | KX405 | 9% | Example 1 | Textured | 10 | 1.07 | 0.02 |
| G2 | KX405 | 9% | Example 3 | Textured | 10 | 1.07 | 0.01 |
| H1 Comparative | D1192 | 37% | Example 1 | Web mark | 10 | 1.00 | 0.01 |
| H2 Comparative | D1192 | 37% | Example 3 | Web mark | 10 | 0.99 | 0.02 |

The results demonstrated that relief printing form of Samples G1 and G2 that includes a photopolymerizable composition having a poly(styrene-butadiene-styrene) binder with less than 15% 1,2-coupled units (vinyl content) of the polybutadiene segment has improved ink transfer as shown by the higher ink density compared to a relief printing form that includes a poly(styrene-butadiene-styrene) binder having a vinyl content greater than 15%. Some of the Samples from Examples 2 and 3 were tested for surface roughness characteristics on a Hommelwerke T2000 Profilometer made by Hommelwerke GmbH (Mulhhause, Germany). The surface of a sample was measured and Rmax was reported which is the value of the vertical distance between the highest peak and lowest valley measured along one cut-off length (0.03 in.), and reflects the depth of the most severe web marks on the cutoff measured for the sample. Each sample was measured twice and separately reported in the table below.

Comparison of Samples D1 against Samples F1 demonstrated that the textured printing surface of a printing form prepared according to the present method has an increased surface roughness compared to the exterior surface of a printing form prepared by solvent processing. Comparison of Samples D1 against Samples H1 demonstrated that the maximum depth (Rmax) of the printing surface having web marks is about 1 micron deeper than the maximum depth of texturing of the printing surface

| | Sample D1 | Sample F1 | Sample H1 (Comparative) |
|---|---|---|---|
| Development Process | Thermal | Solvent | Thermal |
| Surface structure | Textured | Smooth | Web-marks |
| Rmax (1) | 2.5 micron | 1.2 micron | 3.4 micron |
| Rmax (2) | 2.0 micron | 1.2 micron | 3.6 micron |

What is claimed is:

1. A method for preparing a printing form from a photopolymerizable element comprising:

a) providing a photopolymerizable element comprising a layer of a photopolymerizable composition comprising at least one elastomeric block copolymer having one or more non-elastomeric blocks and one or more elastomeric blocks of polybutadiene having 1,2-coupled units, an ethylenically unsaturated compound and a photoinitiator, wherein the photopolymerizable composition layer is capable of being partially liquefied, and wherein the photopolymerizable element further comprises an actinic radiation opaque layer disposed thereon forming an in-situ mask on the element;

b) imagewise exposing the photopolymerizable element through the in-situ mask to actinic radiation in the presence of atmospheric oxygen;

c) heating the element of b) to a temperature sufficient to cause a portion of the layer to liquefy; and d) contacting an exterior surface of the photopolymerizable element with a development medium to allow at least a portion of the liquefied layer to be removed by the development medium;

wherein the 1,2-coupled butadiene units comprise less than 15% by weight of the one or more polybutadiene blocks, and the elastomeric block copolymer is at least 30% by weight, based on the total weight of the photopolymerizable composition, wherein the photopolymerizable composition further comprises a plasticizer, wherein the plasticizer is selected only from liquid polythene plasticizers having a vinyl content of not less than 60% by weight of the polydiene, and wherein the printing form resulting from the method has a textured printing surface.

2. The method of claim 1 wherein the 1,2-coupled butadiene units is 5 to 10% by weight of the one or more polybutadiene blocks.

3. The method of claim 1 wherein the elastomeric block copolymer has a molecular weight between 80,000 and 200,000.

4. The method of claim 1 wherein the elastomeric block copolymer has a styrene content of 15 to 35% by weight, based on the block copolymer.

5. The method of claim 1 wherein the elastomeric block copolymer comprises a mixture of a tri-block copolymer of polystyrene-polybutadiene-polystyrene, and a di-block copolymer of polystyrene-polybutadiene, wherein the di-block copolymer is less than 20% by weight based on the weight of the elastomeric binder.

6. The method of claim 1 wherein the elastomeric block copolymer is 30 to 80% by weight, based on the total weight of the composition.

7. The method of claim 1 wherein the photopolymerizable composition further comprises an additional block copolymer that is selected from the group consisting of a block copolymer of styrene and butadiene, and a block copolymer of styrene and isoprene.

8. The method of claim 7 wherein the additional block copolymer is from 5 to 30 weight % of the composition.

9. The method of claim 1 wherein the plasticizer is from 1 to 30% by weight of the photopolymerizable composition.

10. The method of claim 1 wherein the elastomeric block copolymer is a styrene-butadiene-styrene tri-block copolymer having less than 1% by weight of styrene-butadiene di-block based on the weight of the elastomeric block copolymer; 22 to 26% by weight of styrene based on the weight of the elastomeric block copolymer; less than 10% by weight of 1,2-coupled butadiene units based on the one or more polybutadiene blocks; and a molecular weight of about 100,000 to 150,000 g/mol.

11. The method of claim 1 wherein after step d) the photopolymerizable element has a relief surface, the method further comprising post-exposing the photopolymerizable element by overall exposing the relief surface to the actinic radiation.

12. The method of claim 1 wherein after step d) the photopolymerizable element has a relief surface, the method further comprising exposing the relief surface of the photopolymerizable element to radiation of between 200 and 300 nm.

13. The method of claim 1, wherein the elastomeric block copolymer is from 40% to 75% by weight of the photopolymerizable composition.

14. The method of claim 13, wherein the plasticizer is selected only from liquid polydiene plasticizers having a vinyl content of not less than 60% by weight of the polydiene and a molecular weight less than 5000, and the total amount of plasticizer in the photopolymerizable composition is 1 to 25% by weight, based on the total weight of the photopolymerizable composition.

15. The method of claim 1, wherein the photopolymerizable composition contains one or more of said liquid polydiene plasticizers having a vinyl content of not less than 60% by weight of the polydiene, at least one of which is liquid 1,2-polybutadiene oil having a vinyl content of not less than 85% by weight.

16. The method of claim 1. wherein the plasticizer is selected only from liquid polydiene plasticizers having a vinyl content of not less than 60% by weight of the polydiene and a molecular weight less than 5,000.

* * * * *